(12) United States Patent
McGrath

(10) Patent No.: US 7,321,913 B2
(45) Date of Patent: Jan. 22, 2008

(54) DIGITAL MULTIRATE FILTERING

(75) Inventor: David S. McGrath, Rose Bay (AU)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 843 days.

(21) Appl. No.: 10/731,618

(22) Filed: Dec. 8, 2003

(65) Prior Publication Data

US 2004/0122879 A1   Jun. 24, 2004

(51) Int. Cl.
*G06F 17/10* (2006.01)
(52) U.S. Cl. .......................... 708/313; 708/719
(58) Field of Classification Search ............... 708/300, 708/313
See application file for complete search history.

(56) References Cited

U.S. PATENT DOCUMENTS 5,272,656 A * 12/1993 Genereux .................. 708/322
5,732,002 A *  3/1998 Lee et al. ................... 708/313
6,680,972 B1 * 1/2004 Liljeryd et al. ............ 375/240

OTHER PUBLICATIONS

D.B. Keele, Jr. "Log Sampling in Time and Frequency: Preliminary Theory and Application." Proceedings of the 97th Convention of the Audio Engineering Society (Nov. 10-13, 1994). San Francisco, CA.
Pseudoinverse, from Wikipedia, available at en.wikipedia.org/wiki/Pseudo_inverse retrieved on Aug. 22, 2007.
Weisstein, Eric W. "Moore-Penrose Matrix Inverse." From MathWorld—A Wolfram Web Resource, available at mathworld.wolfram.com/Moore-PenroseMatrixInverse.html retrieved on Aug. 22, 2007, 2007.

* cited by examiner

*Primary Examiner*—Chuong D Ngo
(74) *Attorney, Agent, or Firm*—Dov Rosenfeld; Inventek

(57) ABSTRACT

A method of determining filter coefficients for filter stages in a multirate digital filter device to achieve a desired filter response. The method includes the step of determining a first plurality of evenly spaced sample points representing the desired response function on a logarithmic time scale, such that the sample points of the first plurality have an increasing spacing when viewed in a linear time scale. The method further includes the step determining filter coefficients for each filter stage from an associated group of sample points out of the first plurality of sample points.

18 Claims, 7 Drawing Sheets

DIGITAL MULTIRATE FILTERING

RELATED PATENT APPLICATIONS

This invention claims priority under 35 USC 119 of Australian Provisional Patent Application No. 2002953284 filed Dec. 12, 2002 entitled "Digital Multirate Filtering," assigned to the assignee of the present invention, and incorporated herein by reference.

FIELD OF THE INVENTION

The present invention relates broadly to a method for determining filter coefficients for filter stages in a multirate digital filter, and to a multirate digital filter device.

BACKGROUND OF THE INVENTION

FIG. 1 shows a simplified block diagram of a multirate digital filter 10 to digitally filter an input signal 12, for example in the form of a 96 kHz datastream as used in audio signal processing. While a filter structure such as shown in FIG. 1 may in general be prior art, such a filter structure that uses filter coefficients determined according to one or more aspects of the invention is not prior art. The multirate filter 10 includes a plurality of digital FIR filter devices 16_0, 16_1, 16_2, . . . , 16_n, where the number of FIR filter devices in the plurality is n. The FIR filter device 16_0 in the example shown in FIG. 1 includes a 57 tap FIR filter, whereas the remaining n−1 FIR filter devices 16_1, . . . , 16_n include 29 tap FIR filters. Other embodiments that use FIR filters may have filters with a different number of taps.

For each of the stages associated with the FIR filter devices 16_1 to 16_n, a rate decimation by factor of 2 is performed prior to filtering by the respective FIR filter devices 16_1, . . . , 16_n. A rate multiplication by a factor of 2 also is performed in each of the stages on the output side, with the outputs being summed over the various stages to generate the summed output 18 of the multirate filter 10. The summers sum signals samples at the same rate.

In multirate filter designs such as the ones shown in FIG. 1, changes of the sample rates between the different stages are exploited to increase computational efficiency while achieving a desired filter response over a relatively wide frequency range.

Each sample rate change is achieved, for example, by using a low-pass anti-alias filter.

There is a need in the art for a method of determining filter coefficients for the filter stages of a multirate filter, e.g., a multi-stage filter structure such as shown in FIG. 1, in order to achieve a desired filter response. Achieving a desired filter response may be achieved, for example, by a method of determining coefficients that achieve in a filter an actual filter response that is a close match to the desired response.

SUMMARY OF THE INVENTION

In accordance with a first aspect of the present invention, there is provided a method of determining filter coefficients for filter stages in a multirate digital filter device to achieve a desired filter response. The method includes the steps of:

(a) determining a first plurality of evenly spaced sample points representing the desired response function on a logarithmic time scale, such that the sample points of the first plurality have a geometrically increasing spacing when viewed in a linear time scale, and (b) determining filter coefficients for each filter stage from an associated group of sample points out of the first plurality of sample points.

In one embodiment, the method includes, prior to step (a), determining a second plurality of sample points representing the desired response function on a logarithmic frequency scale, and deriving the sample points of the first plurality representing the desired response function in the logarithmic time scale from the sample points of the second plurality.

In one embodiment, the step of deriving the sample points of the first plurality from the sample points of the second plurality is further based on a desired phase response of the multirate digital filter device.

The step of deriving the sample points of the first plurality from the sample points of the second plurality may include deconvoluting the desired response function in the logarithmic frequency scale using a set of prototype filter response functions, and deriving the first plurality of sample points representing the desired response function in the logarithmic time scale from a summation of corresponding prototype filter response functions.

In one embodiment, the filter coefficients for each filter stage are determined such that a last tap in one stage is equal to a first tap in the next lower rate filter stage.

Step (b) may include, for each associated group of sample points out of the first plurality of sample points, applying a transform matrix to determine the filter coefficients of the associated filter stage.

Preferably, for at least some of the associated groups of sample points the same transformation matrix is applied to determine the filter coefficients of the respective associated filter stages.

Advantageously, the transformation matrices are based on a substantially inverse filter response characteristic analysis of the individual filter taps of the respective filter stages.

In accordance with a second aspect of the present invention there is provided a multirate digital filter device including a plurality of filter stages, an interface unit for inputting a desired filter response of the digital filter device, and a processor unit for determining filter coefficients for the filter stages to achieve the desired filter response, wherein the processor unit is arranged, in use, such that a response function representing the input desired filter response on a logarithmic frequency scale is transformed into a logarithmic time scale, a first plurality of sample points representing the response function in the logarithmic time scale is determined, such that the sample points of the first plurality have an increasing pitch when viewed in a linear time scale, and the filter coefficients for each filter stage are determined from an associated group of sample points out of the first plurality of sample points.

In one embodiment, the processor unit is further arranged, in use, to determine a second plurality of sample points representing the desired response function on a logarithmic frequency scale, and to derive the sample points of the first plurality representing the desired response function in the logarithmic time scale from the sample points of the second plurality.

The processor unit may further be arranged such that, in use, the deriving the sample points of the first plurality from the sample points of the second plurality is further based on a desired phase response of the multirate digital filter device.

In one embodiment, the processor unit is arranged such that, in use, the deriving the sample points of the first plurality from the sample points of the second plurality includes deconvoluting the desired response function in the logarithmic frequency scale using a set of prototype filter response functions, and to derive the first plurality of sample points representing the desired response function in the logarithmic time scale from a summation of corresponding prototype filter response functions.

The device is preferably arranged, such that, in use, filter coefficients for each filter stage are determined such that a last tap in one stage is equal to a first tap in the next lower rate filter stage.

In one embodiment, the processor unit is arranged such that, in use, the determining of the filter coefficients for each filter stage from an associated group of sample points out of the first plurality of sample points includes, for each associated group of sample points out of the first plurality of sample points, applying a transform matrix to determine the filter coefficients of the associated filter stage.

Preferably, the processor unit is arranged such that, in use, for at least some of the associated groups of sample points the same transformation matrix is applied to determine the filter coefficients of the respective associated filter stages.

Advantageously, the processor unit is arranged, in use, to base the transformation matrices on a substantially inverse filter response characteristic analysis of the individual filter taps of the respective filter stages.

In accordance with a third aspect of the present invention, there is provided a data storage medium having stored thereon computer readable data for instructing a computer to execute a method as defined in the first aspect.

BRIEF DESCRIPTION OF THE DRAWINGS

Preferred embodiments of the present invention will now be described, by way of example only, with reference to the accompanying drawings.

DETAILED DESCRIPTION

FIG. 2A through FIG. 2E illustrate a method of determining filter coefficients for filter stages in a multirate digital filter embodying the present invention.

Figure 2A:
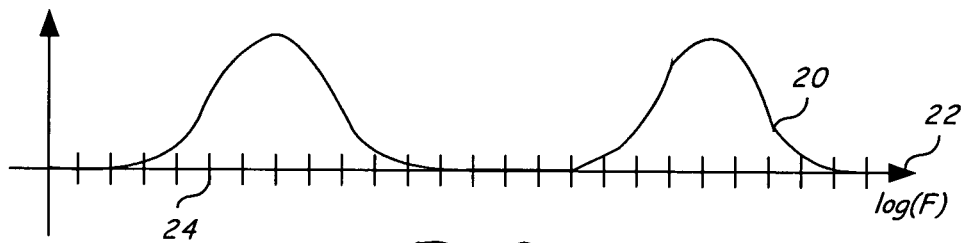
FIGS. 2A through FIG. 2E are graphs illustrating a method of determining filter coefficients for filter stages in a multirate digital filter embodying the present invention.

The starting point in FIG. 2A is a desired response function 20. In the example shown, the desired response function 20 is presented on a logarithmic frequency scale 22. Sampling points, e.g. 24 are shown in FIG. 2A along the logarithmic frequency scale 22. A person skilled in the art will understand that for this example, only the amplitude response is shown for the sake of simplicity, and that an actual response is complex valued. It will be also be appreciated by a person skilled in the art that the logarithmic-frequency-scale sampling points therefor have a geometrically increasing spacing or pitch when viewed on a linear frequency scale.

Figure 2B:
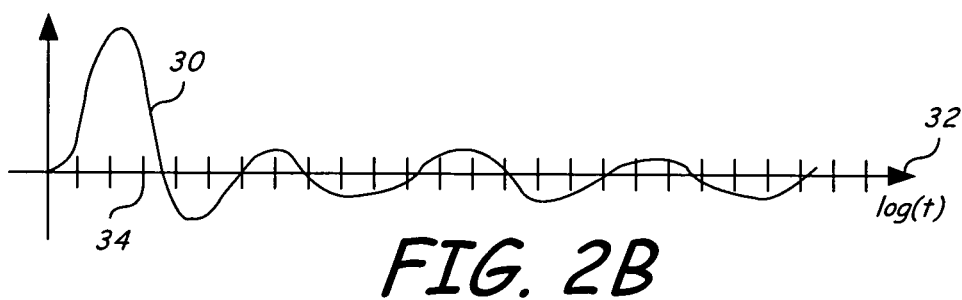

The logarithmic frequency scale samples, e.g. 22 are initially "transformed" into logarithmic time scale samples, e.g. 34 of representing the (impulse) response function 30 along a logarithmic time scale 32, as illustrated in FIG. 2B. The transformation from a logarithmic frequency-scale desired response to a logarithmic time-scale response is described later.

Figure 2C:
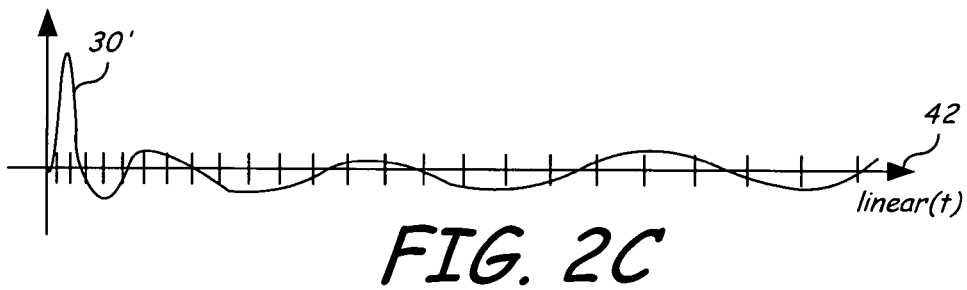

FIG. 2C shows the impulse response function 30 when viewed on a linear time scale 42, i.e., illustrating the geometrically increasing spacing of the sample points, e.g. 34 in the linear time scale.

Figure 2D:

In FIG. 2D, a representation of the sample points only, e.g. a sample point 34, on the linear time scale 42 is shown.

Figure 2E:
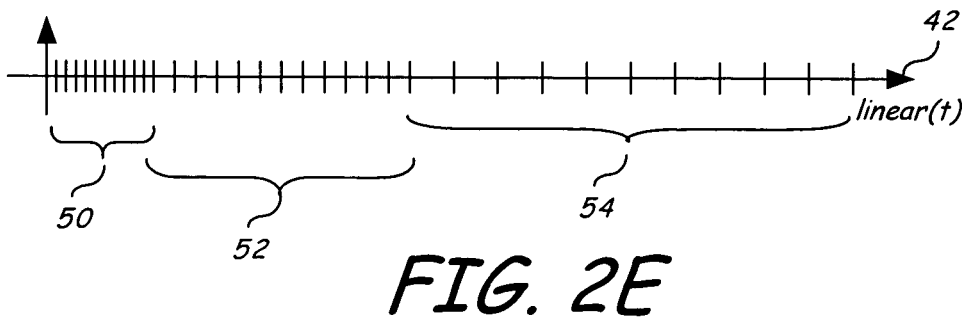

It has been recognized by the applicant that the geometrically increasing spacing on the linear time scale of the samples, e.g. 34, make this sampling well suited for determining filter coefficients of a multirate digital filter device having a multi-stage architecture. As illustrated in FIG. 2E, the time samples of different stages of the filter, e.g. sample sets 50, 52, 54 of constant time spacing taps in three corresponding consecutive stages of a multirate, multi-stage filter configuration, with increasing spacing between time samples of consecutive stages, has an "approximation" relation to the plurality of sample points of FIG. 2D.

Figure 1:
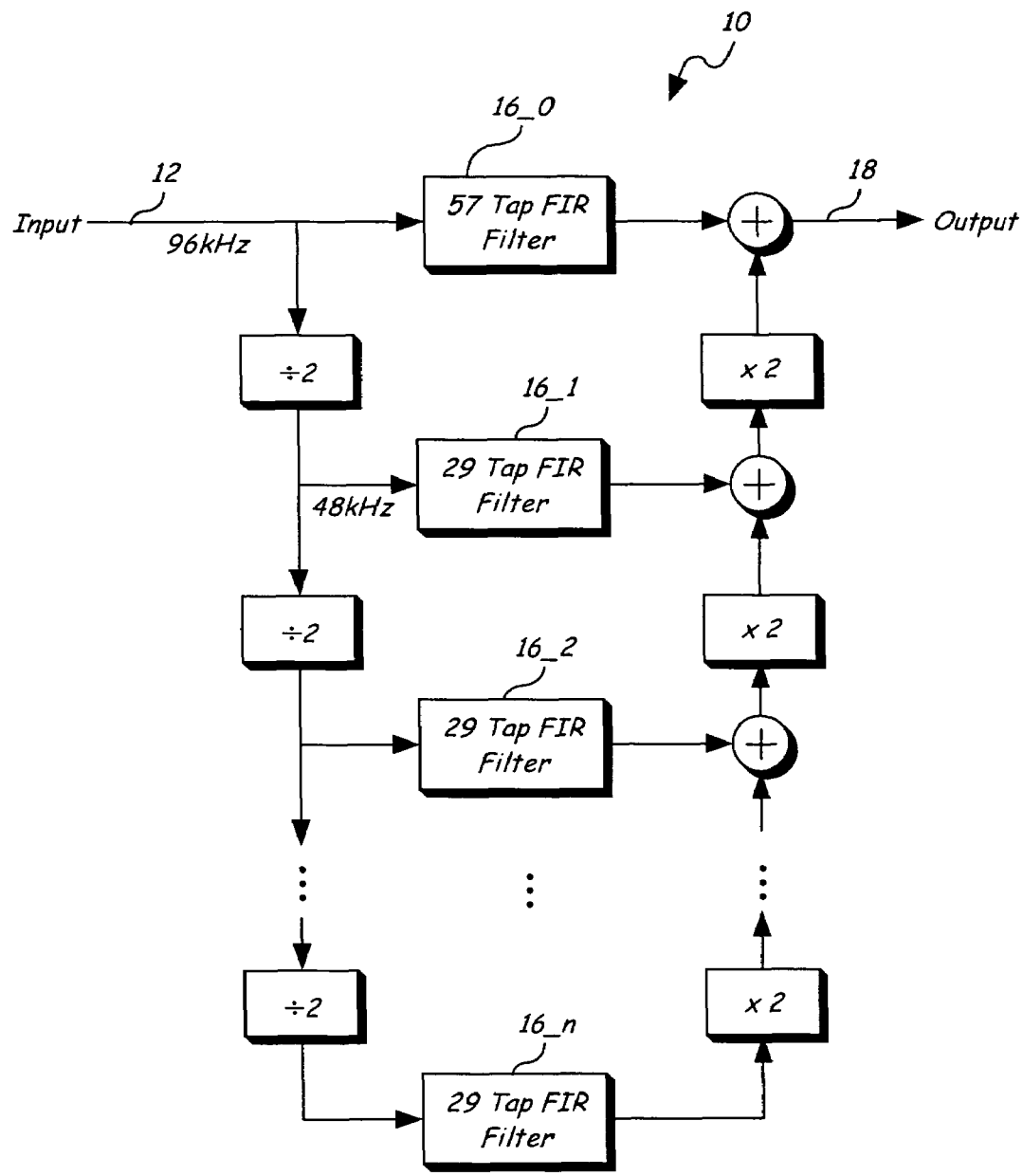
FIG. 1 shows a schematic drawing illustrating a multirate digital filter configuration.

In the following, a conversion process will be described by way of an example, to convert a time-domain filter response with equally spaced time samples on a logarithmic time scale, e.g., a response such as that shown in FIG. 2B, with its associated time-domain sample points, to the filter coefficients of a multirate digital filter that has a structure such as shown in FIG. 1, and that includes an embodiment of the present invention.

Figure 3:
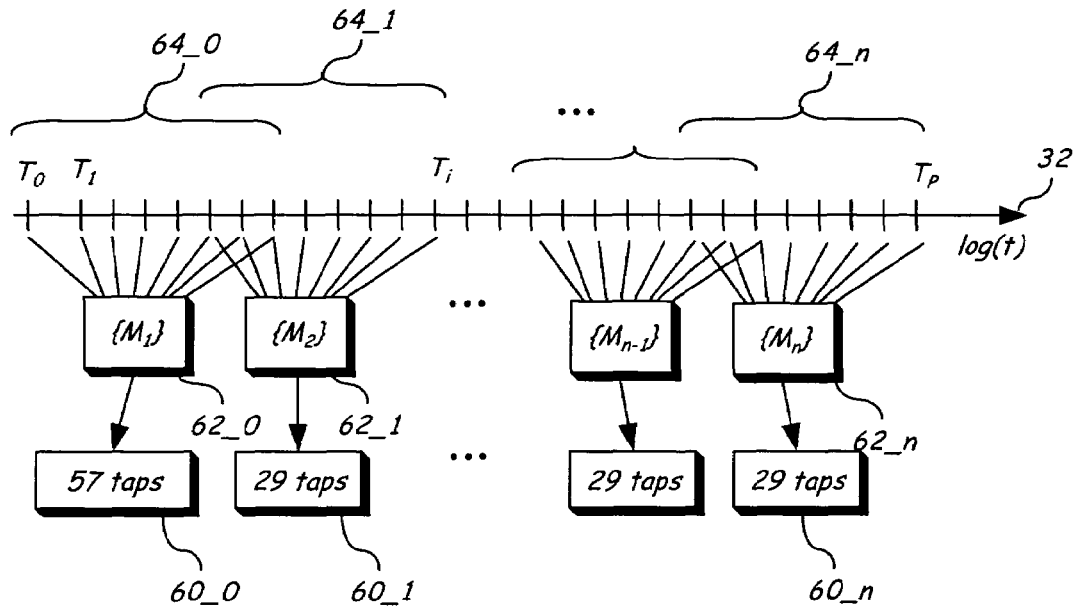
FIG. 3 is a schematic drawing illustrating the determination of filter coefficients for filter stages of a multi-stage digital filter device embodying the present invention.

FIG. 3 shows a set of sample points $T_1$ to $T_P$ that are equally spaced in the logarithmic time scale 32. In addition, one instant in time, denoted $T_0$, is used to indicate an initial time that might, on a linear scale, be time zero.

In one embodiment, to calculate the filter coefficients for the various filter stages 60_0 to 60_n, transformation matrices 62_0 to 62_n are applied to respective groups 64_0 to 64_n, each of associated consecutive sample points out of the sample points $T_0$ to $T_N$. Note as shown in FIG. 3, each group of samples, e.g., group 64_i for the i'th group may overlap, i.e., have some samples in common, with the next group of samples 64_(i+1).

In one embodiment, the matrices 62_0 to 62_n are based on a pseudo inverse filter response characteristic analysis of the individual filter taps of the respective filter stages 60_0 to 60_n, which can be derived for a given multirate digital filter configuration.

It has been found by the applicant that in a typical multirate digital filter configuration such as the one illustrated in FIG. 1, the transformation matrices (62_0 to 62_n) for at least some of the filter stages are the same, thus reducing the complexity of the determination of the filter coefficients in a preferred embodiment. For example, matrices 62_2 to 62_n may considered to be identical (so that only matrices 62_0, 62_1 and 62_1 need to be used for this process).

Figure 4:
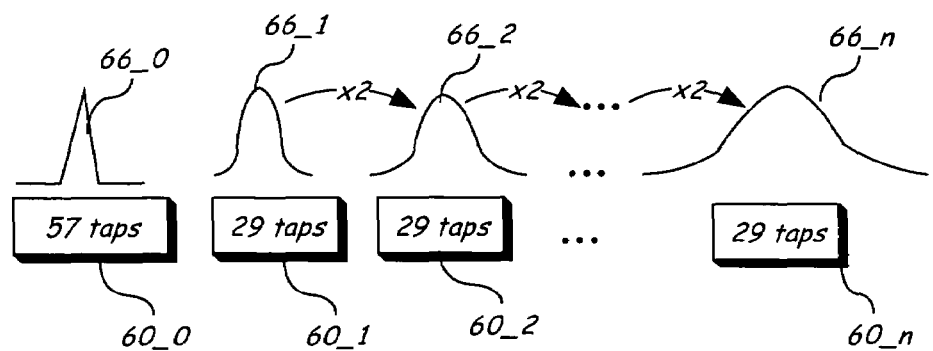
FIG. 4 is a schematic drawing illustrating an analysis of individual filter responses of taps from different filter stages of a multi-rate digital filter device embodying the present invention.

As illustrated in FIG. 4, it has been found by the applicant that response characteristics 66_0 to 66_n representative of the shape of the individual filter taps characteristics within each filter stage 60_0 to 60_n differ from one stage to another. However, there is also a "self-similarity" between some of these filter-tap characteristics, and it has also been found that the same transformation matrix can be used for the calculation of the filter coefficients for filter stages 60_2 to 60_n, with different matrices required for stages 60_0 and 60_1 respectively.

Figure 5:
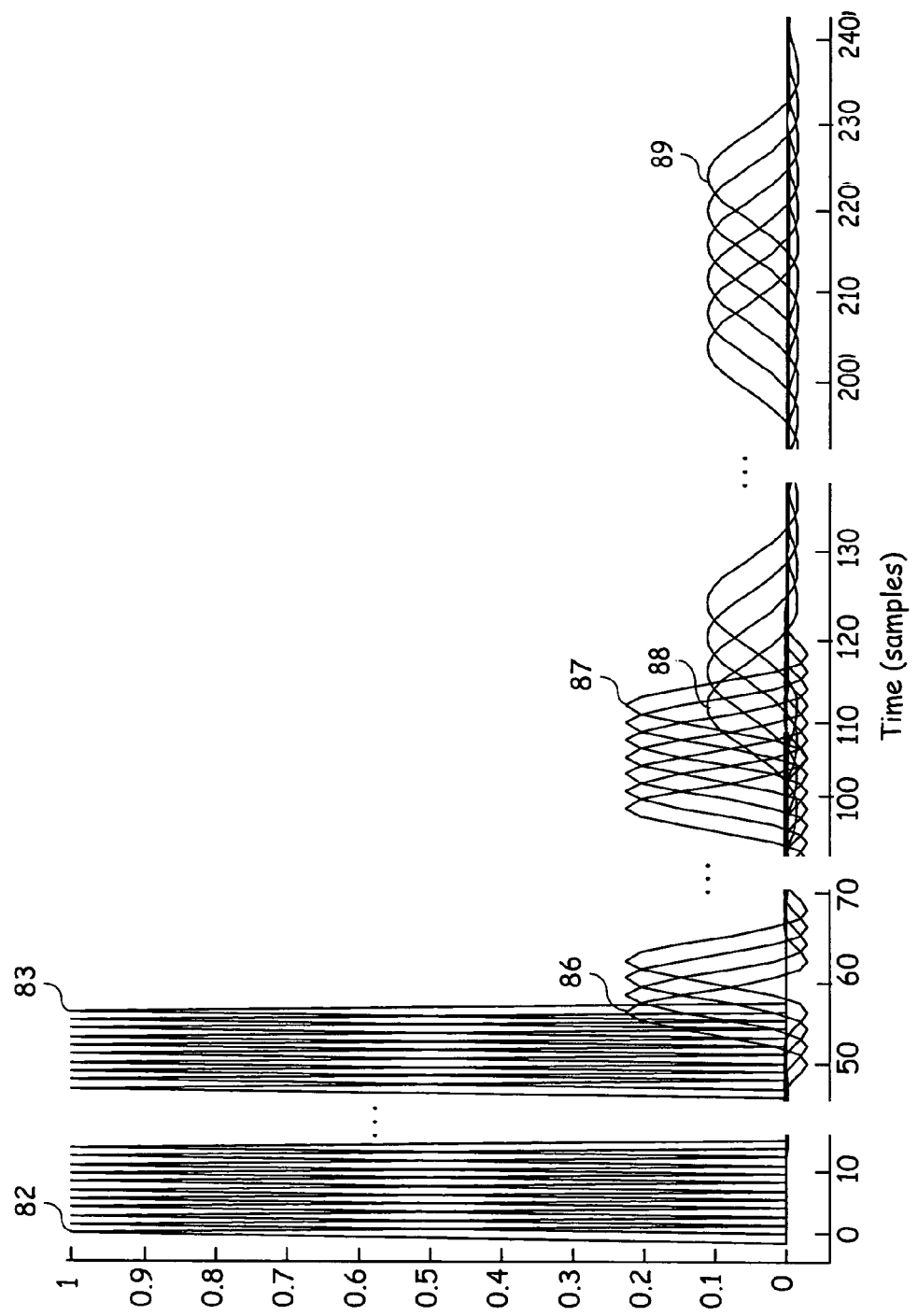
FIG. 5 is graph illustrating a set of multiple impulse responses, corresponding to the various taps of the FIR filters within the multi-rate filter.

FIG. 5 shows a collection of impulse responses, corresponding to each of the FIR filter taps in the multi-rate filter of FIG. 1. For example, the impulse "peak," 82, corresponds to the impulse response of the multi-rate filter that results when all FIR filter coefficients are set to zero, except for the first tap of FIR filter 16_0 (in FIG. 1). Likewise, the delayed impulse, 83, corresponds to the last tap of filter 16_0. The low-pass filtered (and hence broader) curve, 86, corresponds to the first tap of the filter 16_0 (in FIG. 1).

FIG. 5 illustrates the manner in which the impulse response of each successive filter tap becomes more delayed and broader (more low-pass filtered) than its predecessor, although the "broadening" effect is more step-wise, rather than continuous.

Figure 6:
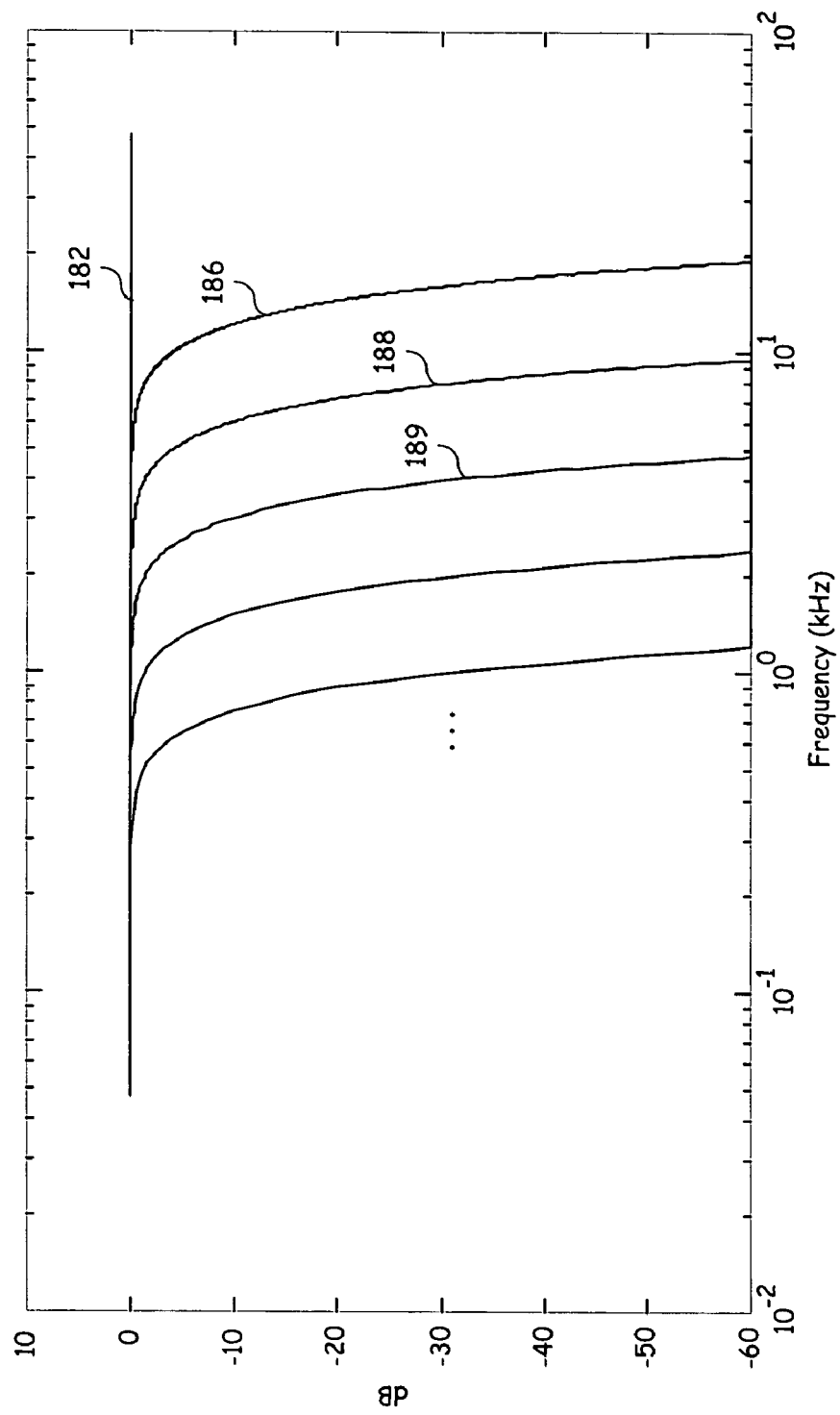
FIG. 6 is a graph illustrating a set of multiple frequency responses, corresponding to each stage of the multi-rate filter.

Turning to FIG. 6, the curves 182, 186, 188, etc. . . . correspond to the frequency responses of impulse responses 82, 86, 88, etc. . . . from FIG. 5. It can be seen, from this figure that curve 188 bears some similarity to curve 186. However, there is greater similarity between curves 189 and 188. In general, the frequency response curve from one of the lower sample-rate stages of the multi-rate filter, e.g. curve 189, bears a very strong similarity to its neighbors. For this reason, the mapping process from the logarithmic time scale impulse response, e.g. FIG. 2C, to the FIR filter taps (FIG. 3) can be simplified by allowing some of the transformation matrices (62_2 to 62_n) to be treated as identical.

In the following, details of a conversion process from the filter response on a logarithmic frequency scale (compare FIG. 2A) to the response function on a logarithmic time scale (compare FIG. 2B) and associated sample points will be described, embodying the present invention.

Figure 7:
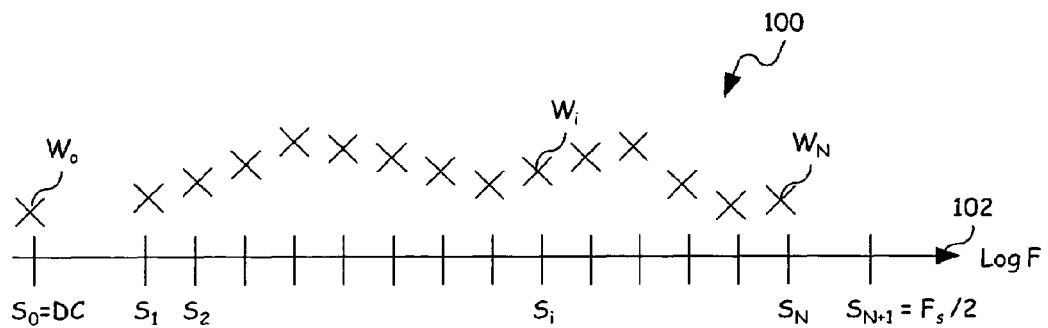
FIG. 7 is a graph illustrating a sampled, desired frequency response on a logarithmic frequency scale, embodying the present invention.

FIG. 7 shows the sampled desired frequency response 100 on a logarithmic frequency scale 102. In the example shown in FIG. 7, the spacing between the sample points $S_1$ to $S_N$ (in octaves) is about 1/24 (and optionally chosen such that 1 kHz falls onto one sample point). In addition, sample points $S_0$ and $S_{N+1}$ are included, with $S_0$ corresponding to DC (0 Hz), and $S_{N+1}$ corresponding to $F_S/2$ (with $F_S$ being the desired sampling rate). The desired frequency response points are defined as $W_0$, $W_1$, . . . $W_i$, . . . $W_N$. Note that each of the frequency response values $W_1$ to $W_{N-1}$ will, in general, be complex (whilst the end values, $W_0$ and $W_N$ will generally by real). Preferably, the complex frequency response $W_0$ to $W_N$ will have been chosen to ensure that the corresponding time domain impulse response is causal (so that the impulse response contains no non-zero components at negative time points).

Figure 8:
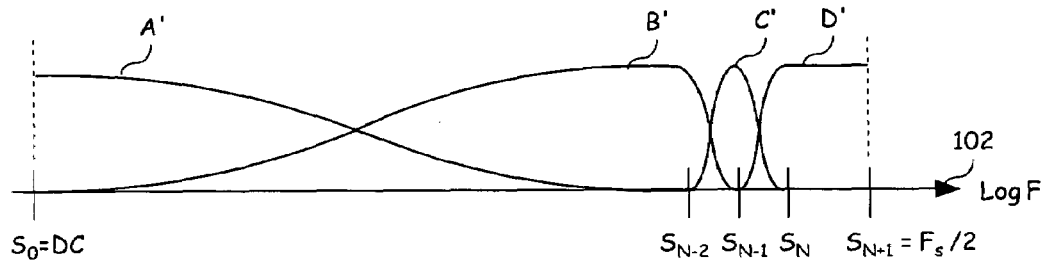
FIG. 8 is a graph illustrating prototype filter response functions used in an embodiment of the present invention.

Turning now to FIG. 8, a number of prototype or building block filter functions A', B', C', and D' are used in deriving corresponding sampling points on a logarithmic time scale. In a first phase, A' is fitted to sampling points $S_0$ and $S_{N-2}$. B' is fitted to sampling points $S_0$, $S_{N-2}$, and $S_{N-1}$. C' is fitted to sample points $S_{N-2}$, $S_{N-1}$ and $S_N$. Finally, D' is fitted to sampling points $S_{N-1}$, $S_N$, and $S_{N+1}$.

Figure 9:
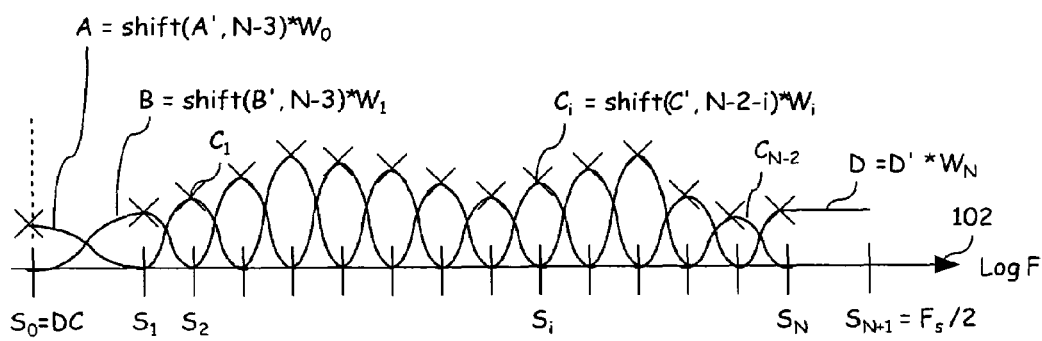
FIG. 9 is a graph illustrating the use of the prototype filter responses in building the composite desired frequency response.

As illustrated in FIG. 9, the subsequent procedure involves applying the desired frequency response values ($W_0$ to $W_N$) to the prototype building block functions, as well as the iterative fitting of C to consecutive triplets of sample points $S_i$, $S_{i+1}$, and $S_{i+2}$, with i=1, 2 . . . , N−3. At the same time, A' and B' are shifted (N−3)-times, as illustrated in FIG. 9, to form the desired curves A and B. Also, D is derived from D' without any shifting being required. It will be appreciated by a person skilled in the art that at each iteration, the "new" fit for A, B, $C_i$ and D can be expressed as:

$$A = \text{shift}(A', N-3) * W_0$$

$$B = \text{shift}(B', N-3) * W_1$$

$$C_i = \text{shift}(C', N-2-i) * W_i (i=1 \ldots N-2)$$

$$D = D' * W_N$$

Figure 10:
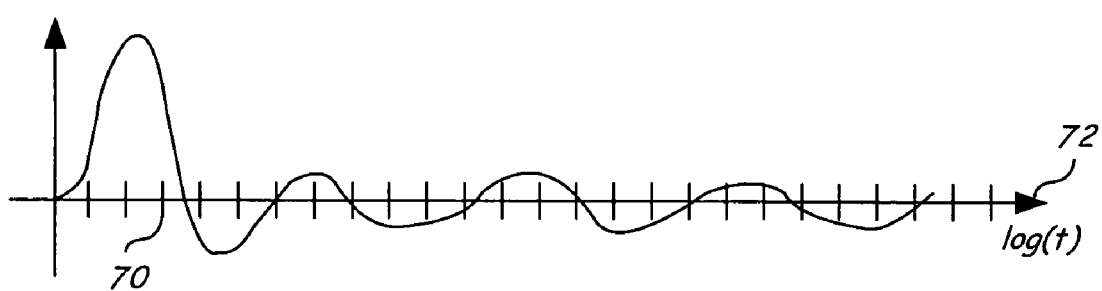
FIG. 10 is a graph illustrating an example impulse response, on a logarithmic time scale.

A summation of the fitted prototype response functions yields a fit to the overall desired response function of the multirate digital filter device. For each prototype frequency-domain curve (A', B', C', D'), there is a corresponding time domain impulse response. It will be appreciated by one skilled in the art that a downward shift along the logarithmic frequency scale of each prototype frequency response (as used to produce A, B, and each $C_i$), corresponds to an equivalent upward shift on the algorithmic time scale. Based on these shifted time-domain prototype filters, the plurality of equally spaced sampling points, e.g. 70 in the logarithmic time scale 72 can be derived as illustrated in FIG. 10, based on pre-determined transformation processing to be applied to the various prototype functions, as fitted.

We note that it will be appreciated by the person skilled in the art that for the desired filter response function, $W_0$ to $W_N$, shown in FIG. 7, there exists a real and imaginary component, which will be processed to arrive at the sample points in the logarithmic time scale. This is achieved by using real and imaginary components of the prototype filter section B' and C' (A' and D' do not have imaginary parts, due to their symmetry).

It has been found by the applicant that the real and imaginary parts of the frequency response, $W_0$ to $W_N$, correspond to even and odd time-domain impulse response functions respectively. Furthermore, if the frequency response, $W_0$ to $W_N$, is causal, then this implies that only the real part of the response needs to be computed. For example, if the real and imaginary parts of $W_0$ to $W_N$ are converted into their corresponding impulse responses:

$$h_r = \text{Convert}(\Re(W_0), \Re(W_1), \ldots \Re(W_N))$$

$$h_i = \text{Convert}(\Im(W_0), \Im(W_1), \ldots \Im(W_N))$$

then we know that $h_r$ will be an even function, and $h_i$ will be an odd function. Therefore:

$$h_r(i) = h_r(-i)$$

$$h_i(i) = -h_i(-i)$$

but, because we have chosen our frequency response to ensure that the impulse response will be causal, we therefore know that:

$h(i) = h_r(i) + h_i(i) = 0 \quad \{i<0\}$ and this implies that:

$h_r(i) = -h_i(i) \quad \{i<0\}$ and the odd and even properties of $h_r$ and $h_i$ therefore mean that:

$h_r(i) = h_i(i) \quad \{i>0\}$ this means that we can compute h(i) from $h_r(i)$ by the following method:

$$h(i) = \begin{cases} 0 & \{i<0\} \\ h_r(i) & \{i=0\} \\ 2h_r(i) & \{i>0\} \end{cases}$$

It has therefore been found by the applicant that, if the frequency response, $W_0$ to $W_N$, is generated or chosen to ensure that the resulting impulse response is causal, then the imaginary parts of the sequence, $W_0$ to $W_N$, can be ignored, and the real part can be used to compute the impulse response by the equation given above.

It will be appreciated by the person skilled in the art that numerous modifications and/or variations may be made to the present invention as shown in the specific embodiments without departing from the spirit or scope of the invention as broadly described. The present embodiments are, therefore, to be considered in all respects to be illustrative and not restrictive.

In the claims that follow and in the description of the invention, except where the context requires otherwise due to express language or necessary implication the word "comprising" is used in the sense of "including," i.e., the features specified may be associated with further features in various embodiments of the invention.

The invention claimed is:

1. A method of determining filter coefficients for filter stages in a multirate digital filter device to achieve a desired filter response, the method comprising the steps of:
   (a) determining a plurality of log-scale sample points representing the desired response function on a logarithmic frequency scale,
   (b) determining a first series of evenly spaced sample points representing the desired response function on a logarithmic time scale, such that the sample points of the first series have an increasing spacing when viewed in a linear time scale, including deriving the sample points of the first series from the log-scale sample points, and
   (c) determining a respective plurality of filter coefficients for each filter stage from an associated group of sample points out of the first series of sample points, such that each plurality of filter coefficients is determined from determined log-scale sample points,
   wherein each successive filter stage in the multirate digital filter device is for linearly spaced samples at a sampling rate that is decimated by an integer factor from the previous filter stage, and
   wherein at least two associated groups of sample points for at least two respective pluralities of filter coefficients for at least two respective successive filter stages have one or more sample points in common.

2. A method as claimed in claim 1, wherein the step of deriving the sample points of the first plurality from the log-scale sample points is further based on a desired phase response of the multirate digital filter device.

3. A method as claimed in claim 1, wherein the step of deriving the sample points of the first plurality from the sample points of the second plurality comprises deconvoluting the desired response function in the logarithmic frequency scale using a set of prototype filter response functions, and deriving the first plurality of sample points representing the desired response function in the logarithmic time scale from a summation of corresponding prototype filter response functions.

4. A method as claimed in claim 1, wherein the filter coefficients for each filter stage are determined such that a last tap in one stage is equal to a first tap in the next lower rate filter stage.

5. A method as claimed in claim 1, wherein step (b) comprises, for each associated group of sample points out of the first plurality of sample points, applying a transform matrix to determine the filter coefficients of the associated filter stage.

6. A method as claimed in claim 5, wherein for at least some of the associated groups of sample points the same transformation matrix is applied to determine the filter coefficients of the respective associated filter stages.

7. A method as claimed in claim 5, wherein the transformation matrices are based on a substantially inverse filter response characteristic analysis of the individual filter taps of the respective filter stages.

8. A multirate digital filter device comprising:
   a plurality of filter stages, each successive filter stage in the multirate digital filter device being for linearly spaced samples at a sampling rate that is decimated by an integer factor from the previous filter stage,
   an interface unit for inputting a desired filter response of the digital filter device, and
   a processor unit for determining filter coefficients for the filter stages to achieve the desired filter response,
   wherein the processor unit is arranged, in use, to transform a response function representing the input desired filter response on a logarithmic frequency scale is transformed into a logarithmic time scale, including:
   (a) determining a plurality of log-scale sample points representing the desired response function on a logarithmic frequency scale,
   (b) determining a first plurality of evenly spaced sample points representing the desired response function on a logarithmic time scale, such that the sample points of the first plurality have an increasing spacing when viewed in a linear time scale, including deriving the sample points of the first series from the log-scale sample points, and
   (c) determining a respective plurality of filter coefficients for each filter stage from an associated group of sample points out of the first plurality of sample points such that each plurality of filter coefficients is determined from determined log-scale sample points,
   wherein at least two associated groups of sample points for at least two respective pluralities of filter coefficients for at least two respective successive filter stages have one or more sample points in common.

9. A device as claimed in claim 8, wherein the processor unit is further arranged such that, in use, the deriving the sample points of the first plurality from the log-scale sample points is further based on a desired phase response of the multirate digital filter device.

10. A device as claimed in claim 8, wherein the processor unit is arranged such that, in use, the deriving the sample points of the first plurality from the log-scale sample points comprises deconvoluting the desired response function in the logarithmic frequency scale using a set of prototype filter response functions, and to derive the first plurality of sample points representing the desired response function in the logarithmic time scale from a summation of corresponding prototype filter response functions.

11. A device as claimed in claim 8, wherein the device is arranged, such that, in use, filter coefficients for each filter stage are determined such that a last tap in one stage is equal to a first tap in the next lower rate filter stage.

12. A device as claimed in claim 8, wherein the processor unit is arranged such that, in use, the determining of the filter coefficients for each filter stage from an associated group of sample points out of the first plurality of sample points comprises, for each associated group of sample points out of the first plurality of sample points, applying a transform matrix to determine the filter coefficients of the associated filter stage.

13. A device as claimed in claim 12, wherein the processor unit is arranged such that, in use, for at least some of the associated groups of sample points the same transformation matrix is applied to determine the filter coefficients of the respective associated filter stages.

14. A device as claimed in claim 12, wherein the processor unit is arranged, in use, to base the transformation matrices on a substantially inverse filter response characteristic analysis of the individual filter taps of the respective filter stages.

15. A computer-readable medium having encoded thereon computer readable data for instructing a computer to execute a method of determining filter coefficients for filter stages in a multirate digital filter device to achieve a desired filter response, the method comprising the steps of:
   (a) determining a plurality of log-scale sample points representing the desired response function on a logarithmic frequency scale,
   (b) determining a first series of evenly spaced sample points representing the desired response function on a logarithmic time scale, such that the sample points of the first series have an increasing spacing when viewed in a linear time scale, including deriving the sample points of the first series from the log-scale sample points, and
   (c) determining a respective plurality of filter coefficients for each filter stage from an associated group of sample points out of the first series of sample points, such that each plurality of filter coefficients is determined from determined log-scale sample points,
   wherein each successive filter stage in the multirate digital filter device is for linearly spaced samples at a sampling rate that is decimated by an integer factor from the previous filter stage, and
   wherein at least two associated groups of sample points for at least two respective pluralities of filter coefficients for at least two respective successive filter stages have one or more sample points in common.

16. A computer-readable medium as claimed in claim 15, wherein the step of deriving the sample points of the first plurality from the log-speced sample points is further based on a desired phase response of the multirate digital filter device.

17. A computer-readable medium as claimed in claim 15, wherein the step of deriving the sample points of the first plurality from the log-spaced sample points comprises deconvoluting the desired response function in the logarithmic frequency scale using a set of prototype filter response functions, and deriving the first plurality of sample points representing the desired response function in the logarithmic time scale from a summation of corresponding prototype filter response functions.

18. A computer-readable medium as claimed in claim 15, wherein the filter coefficients for each filter stage are determined such that a last tap in one stage is equal to a first tap in the next lower rate filter stage.

* * * * *